United States Patent [19]
Greitschus et al.

[11] Patent Number: 5,872,504
[45] Date of Patent: Feb. 16, 1999

[54] SEMICONDUCTOR STRUCTURE LADDER NETWORK CONFIGURATION

[75] Inventors: Norbert Greitschus, Freiburg; Hans-Gunter Zimmer, Denzlingen, both of Germany

[73] Assignee: Deutsche ITT Industries, GmbH, Freiburg, Germany

[21] Appl. No.: 782,777

[22] Filed: Jan. 13, 1997

[30] Foreign Application Priority Data

Jan. 13, 1996 [DE] Germany ................. 196 01 135.3

[51] Int. Cl.⁶ .................................................. H01C 1/01
[52] U.S. Cl. ........................................ 338/320; 323/94 R
[58] Field of Search .................................. 338/293, 319, 338/320, 314, 309, 260, 49, 295

[56] References Cited

U.S. PATENT DOCUMENTS

| | | | |
|---|---|---|---|
| 4,181,878 | 1/1980 | Murari et al. ........................... | 323/94 |
| 4,228,418 | 10/1980 | Piedmont et al. ....................... | 338/195 |
| 4,505,032 | 3/1985 | Praria ..................................... | 29/621 |
| 4,703,302 | 10/1987 | Hino et al. ............................. | 338/293 |
| 5,567,644 | 10/1996 | Rolfson et al. ......................... | 437/60 |

OTHER PUBLICATIONS

Patent Abstracts of Japan, vol. 010, No. 283 (E–400), 26 Sep. 1986 & JP61 102764 A, May 1986.
Copy of European Search Report for EP 97100387.6, dated 14 May 1997.

*Primary Examiner*—Teresa J. Walberg
*Assistant Examiner*—Jeffrey Pwu
*Attorney, Agent, or Firm*—Plevy & Associates

[57] ABSTRACT

A semiconductor structure for creating resistor networks, particularly ladder networks, has resistive sections made of semiconductor material and metal contact areas. A continuous semiconducting resistor strip is provided as a primary arm. Along this continuous primary arm, metal contact areas which contact the resistor strip at the side are provided in accordance with the desired resistor ratio and in order to form corresponding series resistors. In a ladder network, shunt arms have one end connected directly to the long side of the primary arm via the semiconductor material. At the other end of each of the shunt arms, a respective metal contact area is provided.

12 Claims, 1 Drawing Sheet

SEMICONDUCTOR STRUCTURE LADDER NETWORK CONFIGURATION

FIELD OF THE INVENTION

The present invention relates to a semiconductor structure for creating resistor networks and particularly, ladder networks having resistor strips of semiconductor material and metal contact areas.

BACKGROUND OF THE INVENTION

It is generally well known that resistor networks offer significant advantages over the use of discrete components. For example, resistor networks provide substantial reductions in board space, improved reliability by providing reduced numbers of solder joints, and improved temperature performance in terms of temperature coefficient tracking.

Such advantages are especially realized with well known semiconductor ladder-resistor networks. Ladder networks are typically fabricated using a primary arm made of semiconductor material which is interrupted in its longitudinal direction by metal contact areas according to the desired resistor ratio and in order to form corresponding series resistors. To each of these metal contact areas, a respective shunt arm of semiconductor material is connected via a respective metal interconnection to form shunt resistors. The metal contact areas within the primary arm cause undesirable, sometimes even non-ohmic, contact resistances which are in series with the actual series resistors of the primary arm and falsify the values of the series resistors. A specific problem arises from the fact that from a production point of view, these contact resistances are unstable, so that the exact value of the contact resistance varies and is not predeterminable. Furthermore, because of the contact resistances, the actual desired series resistance cannot be made arbitrarily small, because the total resistance is always at least as high as twice the contact resistance. Corresponding contact resistances, and the above-described problems associated therewith, also occur at the metal interconnections between the primary arm and the shunt arms.

It is, therefore, an object of the present invention to provide an improved semiconductor ladder-resistor network structure in which the effect of parasitic resistances is substantially reduced over the above described prior art structures.

SUMMARY OF THE INVENTION

A semiconductor structure for creating resistor networks which have resistive sections made of semiconductor material and metal contact areas. The semiconductor structure comprises a continuous semiconducting resistor strip forming a primary arm of the structure, and along the primary arm, metal contact areas which contact the primary arm are provided with a desired resistor ratio and in order to form a corresponding series resistor structure.

In one embodiment of the invention, the resistor network comprises a ladder network having semiconducting resistor strips forming shunt arms, each of the shunt arms having a first end connected directly to a long side of the primary arm via the semiconductor resistor strips, and a respective metal contact area provided at a second end of each of the shunt arms.

BRIEF DESCRIPTION OF THE DRAWINGS

The invention will now be explained in more detail with reference to the accompanying drawing, in which.

DETAILED DESCRIPTION OF THE INVENTION

The present resistor structure of the present invention is generally characterized by a continuous semiconducting resistor strip which forms a primary arm of the structure, and along the continuous semiconducting resistor strip, metal contact areas which contact a side of the continuous semiconducting resistor strip in accordance with a desired resistor ratio to form a series resistor structure. In a preferred embodiment of the invention, the resistor network is configured in a ladder network with semiconducting resistor strips forming shunt arms. One end of each shunt arm is connected directly to a long side of the earlier described primary arm via a semiconductor material, and the other end of each shunt arm is provided with a respective metal contact area.

Figure 1:
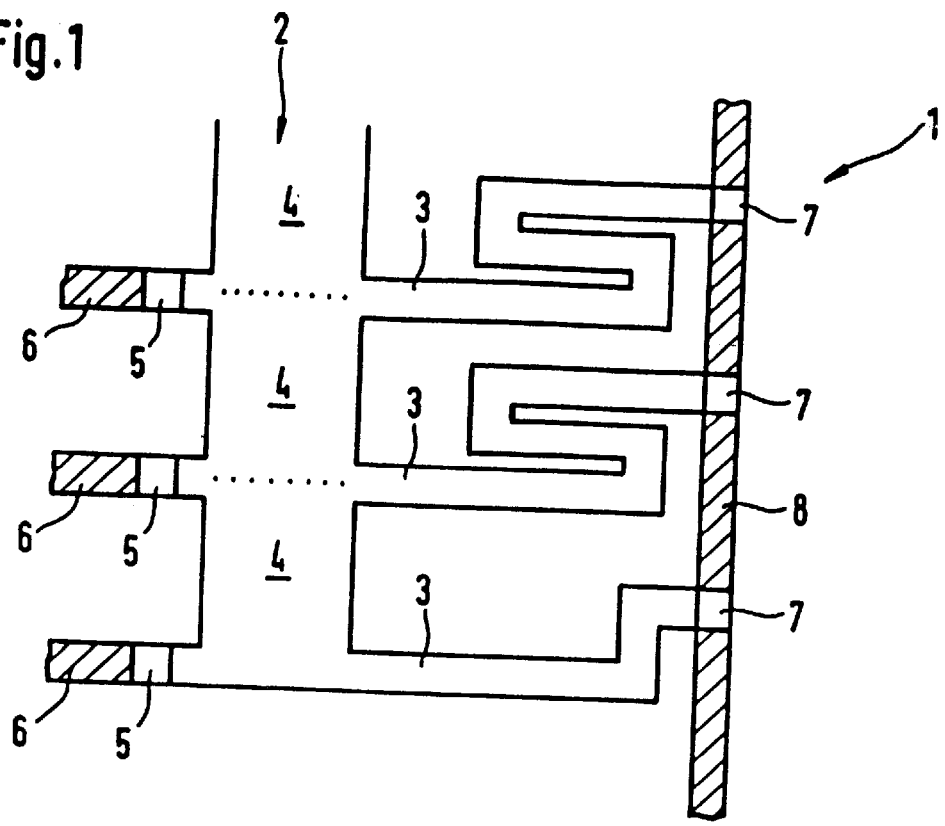
FIG. 1 is a schematic representation of a semiconductor structure forming a ladder network.

Referring now to FIG. 1 a semiconductor structure 1 which forms a resistor-ladder network in accordance with the present invention is shown. The resistor-ladder network 1 consists of a continuous primary arm 2 and several shunt arms 3. Both the primary arm 2 and the shunt arm 3 are made of strips of semiconducting resistor material throughout, the resistance values being determined by the geometry, i.e., particularly by the strip width and length.

Disposed along a first side of the continuous primary arm 2, are metal contact areas 5 which contact the semiconducting resistor strip or primary arm 2 at the first side and form corresponding primary-arm sections 4 which are provided in accordance with a desired resistor ratio. The primary-arm sections 4 shown in FIG. 1 form series coupled resistors 10 as shown in the equivalent circuit diagram of FIG. 2. Connected to each of the contact areas 5 is a respective interconnection 6 which connects the respective contact area 5 to further circuit elements (not shown).

Figure 2:
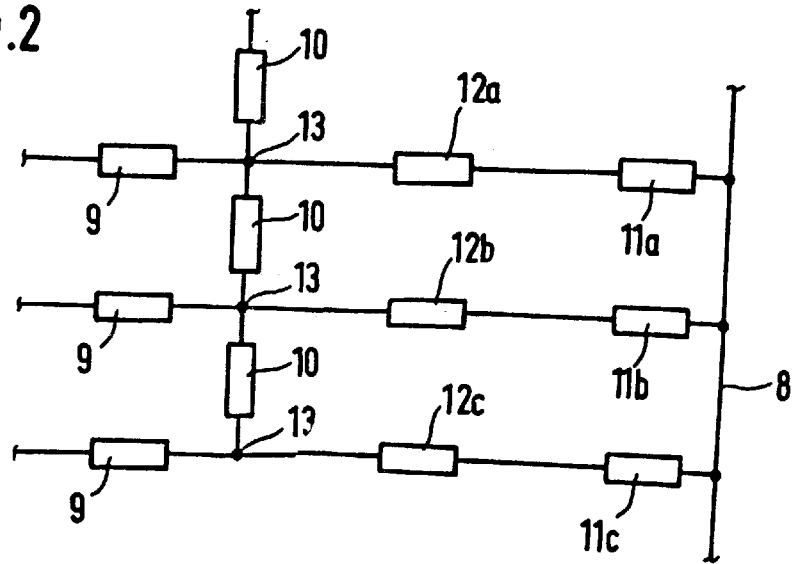
FIG. 2 is an equivalent circuit diagram of the semiconductor structure of FIG. 1.

The semiconductor-metal junctions at the respective contact areas 5, form contact resistances 9 shown in FIG. 2. However, these contact resistances 9 are located outside the primary arm 2, so that the primary arm 2 forms the electrical series combination of series resistors 10 which are determined only by the semiconducting resistor material of the primary arm 2, not by the contact resistances 9. If the contact areas 5 are connected in a suitable manner, e.g., as an operational amplifier feedback path, the current through the contact resistances 9 will be virtually zero, so that the contact resistances 9 will not or only negligibly affect the electrical behavior of the semiconductor structure 1.

Referring again to FIG. 1, on the second side of the primary arm 2, a respective shunt arm 3 is connected to the primary arm 2 directly opposite to a respective contact area 5. The connection between the primary arm 2 and the shunt arm 3 is provided directly via the semiconducting resistor material, i.e., the shunt arms are implemented via the shape and the course of the semiconducting material, so that no metal contacts are necessary between the primary arm 2 and the shunt arms 3. The other end of each shunt arm 3 is provided with respective contact area 7. The contact areas 7 are interconnected via a metal interconnection 8. Through the direct connection between the primary arm 2 and the shunt arms 3 via the semiconducting resistor material, no contact resistances are formed in those areas. As shown in FIG. 2, respective contact resistances 11*a,* 11*b,* 11*c* are only formed at the semiconductor metal junctions between the contact areas 7 and the metal interconnection 8. The total resistance of each shunt arm 3 is thus determined by the series combination of respective shunt resistances 12a, 12b, 12c of the semiconductor material in the shunt arms 3 and the respective contact resistances 11a, 11b, 11c. The shunt resistances 12a, 12b, 12c will generally be high, so that the contact resistances 11a, 11b, 11c will affect the total resistance of their respective shunt arms 3 only to a minimal extent.

Referring again to the equivalent circuit diagram of FIG. 2 it can be seen that each respective contact resistance 9, which is caused by one of the respective contact areas 5 as shown in FIG. 1, and, in a separate current path, a respective resistor series combination, is connected to a respective node 13. The resistor series combination is formed by the shunt resistances 12a, 12b, 12c and the contact resistances 11a, 11b, 11c. The free ends of the contact resistances 11a, 11b, 11c being interconnected via the line 8.

As the contact resistances 9 are located outside the primary arm 2, the resistor ratio in the primary arm 2 is determined solely by the series resistors 10. There are no stray contact resistances in the primary arm 2 that could falsify the resistor ratio. As the contact resistances 9, 11a, 11b, 11c have been moved to areas which are either dead or high impedance, they have no or only a negligible effect on the electrical behavior of the overall arrangement.

Accordingly, through the direct connection of the shunt arms to the long side of the primary arms via the semiconductor material, i.e., through the design of the network, stray contact resistances which are present in those areas are eliminated. Contact resistances only occur at the other ends of the shunt arms, i.e., at the metal contact areas. However, this single contact resistance in each shunt arm affects the total resistance of the shunt arm, and thus the electrical behavior of the network, only slightly, because the shunt arm with its semiconducting resistor material is generally highly resistive anyhow, so that the single contact resistance in each shunt arm has only a negligible effect on the total resistance.

Advantageously, the contact areas of the primary arm are provided on one long side of the primary arm, and the connections of the primary arm to the shunt arms are provided on the other long side. All shunt arms are then located on the same side of the primary arm, and so are the metal contact areas for making contact to the primary arm. This simplifies the further connection of the resistor network within the semiconductor structure. For example, the metal contacts of the shunt arms can be connected to a continuous, linear metal interconnection and tied to a common reference potential. The above-described arrangement of contact areas and shunt arms thus simplifies the fabrication process of the semiconductor structure and minimizes the space required for the resistor network.

It is also advantageous if a respective contact area of the primary arm and a respective connection between the primary arm and a shunt arm located directly opposite each other. The metal contact areas contacting the semiconducting resistor strip of the primary arm at the side and the connections between the primary arm and the shunt arms then form respective nodes which are at the same potential. These common nodes are needed to implement conventional circuits, such as a ladder network.

With the semiconductor structure according to the invention, particularly a ladder network with a primary arm and two or more shunt arms connected thereto can be implemented in which the primary arm has no metal contact areas throughout and in which the semiconductor-metal junctions for the contact areas have been moved to an area which is virtually dead or has such a high impedance that a parasitic contact resistance will affect the electrical behavior of the resistor network only to a negligible extent.

Thus, a resistor series combination is obtained in the primary arm which is not interrupted by metal contacts, so that no stray contact resistances will occur. The contact areas are now located beside the continuous primary arm, whereby the contact resistances are moved to a secondary arm. In practical applications, e.g., in a ladder network in which these secondary arms form the feedback path of an operational amplifier circuit, these secondary arms are practically dead, so that the contact resistances located there are not detrimental.

Thus, in the semiconductor structure according to the invention, the contact resistances still present have been moved to an area where they do not adversely affect the electrical characteristics of the resistor network.

The primary arm is made of semiconducting resistor material throughout, i.e., it does not contain any semiconductor-metal junctions which cause parasitic resistances and alter the electrical behavior of the resistor network in an uncontrolled manner.

However, it is possible, e.g., by introducing local insulating stripes into the semiconducting resistor material of the primary arm or by taking other steps acting on the effective cross section of the primary arm, to selectively influence the resistance of the latter without any parasitic resistances being caused by transitions from the semiconductor material to another, electrically conducting material.

It should be understood that the embodiment described herein is merely exemplary and that a person skilled in the art may make many variations and modifications to the embodiments utilizing functionally equivalent elements to those described herein. Any and all such variations or modifications as well as others which may become apparent to those skilled in the art, are intended to be included within the scope of the invention as defined by the appended claims.

What is claimed is:

1. A semiconductor structure for creating a ladder network having resistive sections made of semiconductor material and metal contact areas, said semiconductor structure comprising:

a primary arm made of a continuous semiconducting resistor strip, metal contact areas positioned along a first long side of said primary arm and which contact said primary arm and provide a resistive effect at said contact areas, and shunt arms made of semiconducting resistor strips, each of said shunt arms having a first end connected directly to a second long side of said primary arm via said semiconducting resistor strips, and a respective second metal contact area provided at a second end of each of said shunt arms, wherein said first and second long sides of said primary arm are oppositely disposed with respect to one another.

2. The semiconductor structure as claimed in claim 1, wherein said shunt arms have a resistance which is a function of the geometry associated with said semiconducting resistor strips.

3. The semiconductor structure as claimed in claim 2, wherein a respective one of said contact areas of said primary arm and a respective one of said connections between said primary arm and a respective one of said shunt arms are located directly opposite to each other.

4. The semiconductor structure as claimed in claim 2, further comprising a metal interconnection where each said second metal contact area connects to said second end of a respective one of said shunt arms, said metal interconnection having a corresponding low resistance in comparison to the resistance associated with each said shunt arm.

5. The semiconductor structure as claimed in claim 4, wherein each one of said metal contact areas in contact with said primary arm operates to segment said primary arm into a plurality of primary arm sections.

6. A resistor ladder network structure comprising:

a primary arm made of a continuous resistor strip of semiconducting material; and a plurality of metal contact areas which contact said primary arm on a first long side thereof, and form said primary arm into a series resistor structure, a plurality of shunt arms made of semiconducting resistor strips, each of said shunt arms having a first end connected directly to a second long side of said primary arm; and a second metal contact area disposed at a second end of each of said shunt arms, wherein said first and second long sides of said primary arm are oppositely disposed.

7. The resistor ladder network structure according to claim 6, wherein said contact areas on said first long side of said primary arm and said shunt arms connected on said second long side of said primary arm are located directly opposite to each other.

8. The resistor ladder network structure according to claim 6 further comprising a metal interconnection where said second metal contact areas at said second end of each of said shunt arms is formed.

9. The resistor ladder network structure according to claim 8, wherein each one of said metal contact areas in contact with said primary arm operates to segment said primary arm into a plurality of primary arm sections.

10. A semiconductor resistor ladder-network structure comprising:

a primary arm made of a continuous resistor strip of semiconducting material; and a plurality of metal contact areas connected to a side of said continuous resistor strip and forming a plurality of series coupled resistors out of said continuous resistor strip;

a plurality of shunt arms, each made of a resistor strip of semiconducting material, each of said resistor strips having a first end and a second end, said first end of each of said resistor strips connected directly to a second side of said continuous resistor strip, and said second end of each of said resistor strips terminating at a metal contact area forming a metal interconnection having a first resistance value associated with said interconnection; wherein each said shunt arm has a resistance based on the resistor strip of semiconducting material which is higher than said first resistance of said metal interconnection.

11. The semiconductor resistor ladder-network structure according to claim 10, wherein a respective one of said contact areas disposed on said side of said continuous resistor strip and a respective one of said resistor strips connected on said second side of said continuous resistor strip are located directly opposite to each other.

12. The semiconductor resistor ladder-network structure according to claim 10, wherein each one of said a plurality of metal contact areas connected to said side of said continuous resistor strip, segment said continuous resistor strip into a plurality of primary arm sections.

* * * * *